United States Patent [19]

Naito et al.

[11] Patent Number: 4,481,279
[45] Date of Patent: Nov. 6, 1984

[54] DRY-DEVELOPING RESIST COMPOSITION

[75] Inventors: Jiro Naito, Kanagawa; Yasuhiro Yoneda, Machida; Kenroh Kitamura, Fujisawa, all of Japan

[73] Assignee: Fujitsu Limited, Kawasaki, Japan

[21] Appl. No.: 385,886

[22] Filed: Jun. 7, 1982

[30] Foreign Application Priority Data

Jun. 9, 1981 [JP] Japan .................................. 56-87565

[51] Int. Cl.$^3$ ............................ G03C 1/72; G03F 7/26
[52] U.S. Cl. .................................... 430/280; 430/270; 430/271; 430/286; 430/296; 430/326; 430/323; 204/159.13
[58] Field of Search ............... 430/281, 285, 280, 286, 430/287, 311, 313, 942, 967, 271, 296, 325, 326, 270; 204/159.13, 159.20, 159.22; 156/643

[56] References Cited

U.S. PATENT DOCUMENTS

| | | | |
|---|---|---|---|
| 2,952,595 | 9/1960 | Jordan et al. | 204/159.2 |
| 3,709,956 | 1/1973 | Nordstrom | 204/159.13 X |
| 3,890,149 | 6/1975 | Schlesinger et al. | 430/273 X |
| 4,048,357 | 9/1977 | Van Paesschen et al. | 430/285 X |
| 4,092,442 | 5/1978 | Agnihotri et al. | 430/330 X |
| 4,143,013 | 3/1979 | Jenkinson et al. | 204/159.22 X |
| 4,232,110 | 11/1980 | Taylor | 430/311 X |

OTHER PUBLICATIONS

Gessner G. Hawley, (ed.), *The Condensed Chemical Dictionary*, (Eighth Edition), (Van Nostrand Reinhold Company, 1971), p. 912.

*Primary Examiner*—John E. Kittle
*Assistant Examiner*—Cynthia Hamilton
*Attorney, Agent, or Firm*—Staas & Halsey

[57] ABSTRACT

A dry-developing positive resist composition consisting of (a) a polymeric material containing, in the molecular structure, unsaturated hydrocarbon bonds inclusive of vinyl, allyl, cinnamoyl, or acryl double bonds or epoxy groups or halogen atoms and (b) 1% to 70% by weight, based on the weight of the composition, of a silicon compound. A positive resist pattern is formed on a substrate by a process comprising coating the substrate with said resist composition, exposing the resist layer to radiation, and developing a resist pattern on the substrate by treatment with gas plasma.

13 Claims, 7 Drawing Figures

DRY-DEVELOPING RESIST COMPOSITION

BACKGROUND OF THE INVENTION

The invention relates to a dry-developing resist composition. More particularly, the invention relates to a positive resist composition which can be developed through an oxygen plasma, argon gas plasma, mixed oxygen-argon gas plasma, or mixed oxygen-fluorine gas plasma after its exposure to radiation such as an electron beam, X-ray, ion beam, or deep ultraviolet ray.

Resists developed using developing liquids have heretofore been used for forming resist patterns in the manufacture of electronic devices such as semiconductor integrated circuits. For instance, polymethyl methacrylate has been used as a positive electron beam resist, and polyglycidyl methacrylate has been used as a negative electron beam resist. Conventional resists developed using developing liquids, however, swell or shrink when developed, thus making it difficult to form patterns of the order of sub-microns.

On the other hand, dry-developing resists have recently been developed, as disclosed, for example, in "Plasma-Developed X-Ray Resists", J. Electrochem. Soc., vol. 127, No. 12, pp. 2665 to 2674. However, conventional dry-developing resists do not have a resistance to plasma high enough for the formation of very fine resist patterns.

SUMMARY OF THE INVENTION

Therefore, it is the primary object of the present invention to make it possible to form resist patterns by dry-developing wherein fine resist patterns can easily be formed.

According to the present invention, there is provided a dry-developing positive resist composition consisting of (a) a polymeric material containing, in the molecular structure, unsaturated hydrocarbon bonds inclusive of vinyl, allyl, cinnamoyl, or acryl double bonds or epoxy groups or halogen atoms and (b) 1% to 70% by weight, based on the weight of the composition, of a silicon compound.

The present invention also provides a process for forming a positive resist pattern on a substrate, comprising coating the substrate with the resist composition, exposing the resist layer to radiation such as an electron beam, X-ray, ion beam, or deep ultraviolet ray, and developing a resist pattern on the substrate by treatment with gas plasma.

BRIEF DESCRIPTION OF THE DRAWINGS

In the accompany drawings.

DETAILED DESCRIPTION OF THE PREFERRED EMBODIMENTS

Figure 1A:
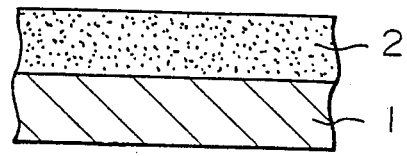
FIGS. 1A to C schematically illustrate steps A through C for forming a resist pattern according to an embodiment of the process of the present invention.

The present invention is based on the fact that a resist material consisting of the aforementioned polymer containing a silicone compound is etched at an extremely low rate through treatment with plasma, and that the resist material, after being exposed to radiation such as an electron beam is etched at an increased rate through the treatment with plasma.

Examples of the polymeric material containing unsaturated hydrocarbon bonds in the molecular structure, which can be used in the present invention, include polymers of alkadienes, such as 1,3-butadiene and isoprene, and cyclized polymers thereof or copolymers thereof with monomers which are copolymerizable with the alkadiene monomers; polymers of dicarboxylic diallyl esters such as diallyl orthophthalate, diallyl isophthalate, and diallyl terephthalate; polymers of triallyl cyanurate and triallyl isocyanurate or copolymers thereof; polymers having cynnamoyl groups such as polyvinyl cinnamate; polymers having acryl groups or methacryl groups in the side chains or at the terminals, and unsaturated polyesters.

Examples of the polymeric material containing epoxy groups include polyglycidyl methacrylate, epoxydated polybutadiene, and glycidyl methacrylate-ethyl methacrylate copolymer. Examples of the polymeric material containing halogen atoms include vinyl halide polymers such as polyvinyl chloride.

The silicon compound may preferably be contained in the resist composition in an amount of 10% to 50% by weight based on the weight of the composition.

Examples of the silicon compound usable for the present invention include the compounds represented by the following formulae I, II, III, IV, and V,

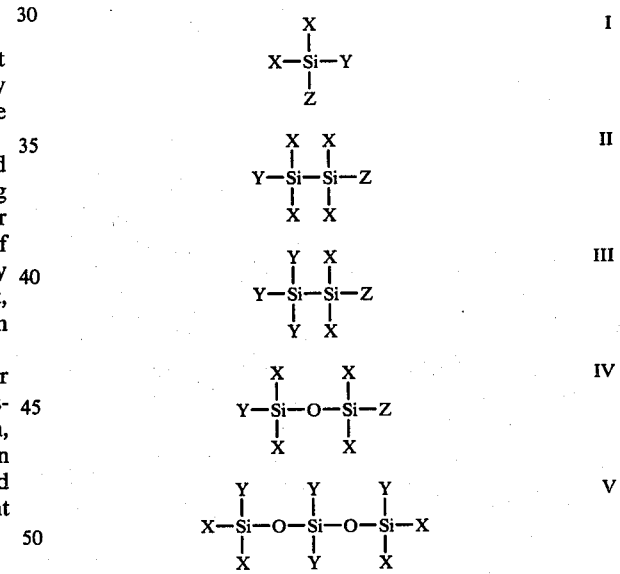

in which each X represents methyl, phenyl, biphenyl, phenylamino, phenoxy, benzyl, cyano, vinyl, or acetoxy; each Y represents hydrogen, hydroxy, azido, vinyl, methoxy, ethoxy, butoxy, phenoxy, halogen, benzyl, phenyl, methyl, t-butyl,biphenyl, or acetoxy; and each Z represents phenyl, hydroxy, vinyl, methoxy, ethoxy, butoxy, benzyl, methyl, t-butyl, phenoxy, halogen, biphenyl, or acetoxy.

Examples of the compounds of the above formula I include bis(p-biphenyl)diphenylsilane, bis(phenylamino)dimethylsilane, t-butyldimethylchlorosilane, t-butyldiphenylchlorosilane, dibenzyldimethylsilane, dicyanodimethylsilane, diphenylsilanediol, tetraacetoxysilane, tetraphenoxysilane, tetraphenylsilane, tribenzylchlorosilane, triphenylchlorosilane, triphenylethylsilane, triphenylfluorosilane, triphenylsilane, triphenylsilanol, triphenylsilylazido, and triphenylvinylsilane.

Examples of the compounds of formulae II and III include 1,2-dimethyl-1,1,2,2-tetraphenyldisilane and 1,1,1-trimethyl-2,2,2-triphenyldisilane. Examples of the compounds of formula IV include 1,3-dimethyl-1,1,3,3-tetraphenyldisiloxane, 1,3-divinyl-1,1,3,3-tetraphenyldisiloxane, and 1,3-ethoxy-1,1,3,3-tetraphenyldisiloxane. As an example of the compounds of formula V, there may be mentioned 1,1,5,5-tetraphenyl-1,3,3,5-tetramethyltrisiloxane.

A further example of the silicon compound is 1,4-bis(hydroxydimethylsilyl)benzene.

Figure 1B:
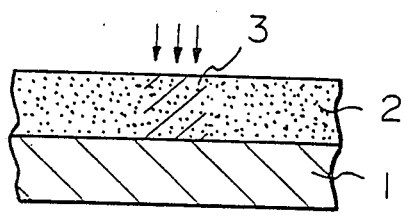
Figure 1C:
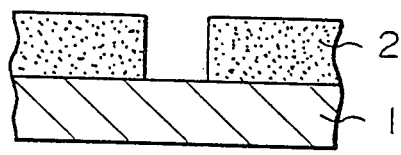
Figure 2A:
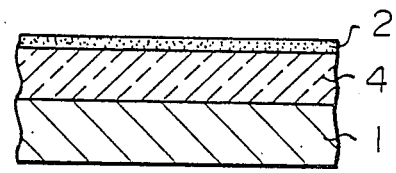
FIGS. 2A to D schematically illustrate steps A through D for forming a resist pattern according to another embodiment of the process of the present invention.
Figure 2B:
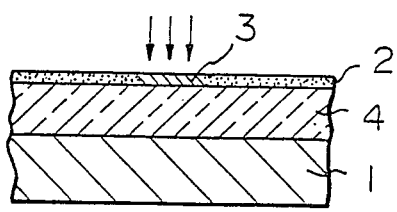
Figure 2C:
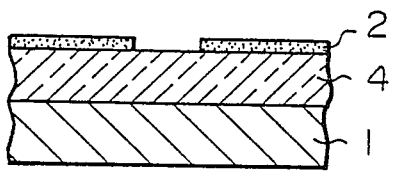
Figure 2D:
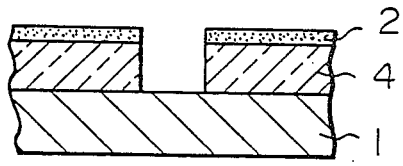

The process for forming patterns according to the present invention is carried out through the following procedure in line with conventional techniques. Referring to FIGS. 1A to C, a resist layer 2 is formed on a substrate 1 at step A. For example, the resist composition is applied by spin-coating and is prebaked at a temperature of 60° C. to 80° C. for 10 to 30 minutes. The resist layer is then exposed to an electron beam or the like at step B. A new material is formed in an exposed portion 3 in the resist layer 2 owing to the chemical reaction. The exposed portion 3 is then removed through treatment with gas plasma such as oxygen plasma, argon gas plasma, mixed oxygen-argon gas plasma, or mixed oxygen-fluorine gas plasma, so that a desired resist pattern is formed at step C.

Referring to FIGS. 2A to D, if desirable, an intermediate layer 4 may be provided between the substrate 1 and the resist layer 2. For example, an intermediate layer 4 is formed on a substrate 1 at step A. The formation of the intermediate layer 4 may be effected by applying a plasma-etchable substance, such as polyvinyl carbazole, polystyrene, phenol resin, cyclized polyisoprene resin, or polyimide, onto the substrate by spin-coating or plasma polymerization. Then, a resist layer 2 is applied onto the intermediate layer also at step A in the same manner as described above with respect to FIGS. 1A to C. Then, the resist layer is exposed to radiation at step B. The exposed portion 3 of the resist layer 2 is removed through treatment with oxygen plasma or the like at step C. Then, the plasma treatment is continued at step D, to etch the intermediate layer 4, so that the desired pattern may be obtained.

According to the present invention, it is possible to obtain a resist which can be dry-developed through treatment with plasma and, hence, to form precise, fine resist patterns.

The invention will further be illustrated below with reference to the following examples.

EXAMPLE 1

A resist solution was prepared by dissolving a mixture of 1.5 g of a cyclized polyisoprene and 0.43 g (22% by weight) of a triphenylsilane in 10.0 g of xylene. The resist solution was applied using a spinner onto a silicon substrate and was heated in a nitrogen stream at 80° C. for 30 minutes. The thickness of the resist film was 1.10 μm. The resist film was then exposed to an electron beam produced at an acceleration voltage of 30 kV and was introduced into a plasma-etching apparatus of the parallel plate-type. After the pressure in the plasma-etching apparatus was reduced to $6 \times 10^{-5}$ Torr, oxygen was introduced thereto. The specimen was treated with plasma under the conditions of an oxygen gas pressure of 0.5 Torr, frequency of applied voltage of 13.56 MHz, and applied electric power of 0.33 watts/cm$^2$ for 30 minutes. Exposed portions of the resist film were removed, and a sensitivity of $1.5 \times 10^{-4}$ C/cm$^2$ was exhibited. The thickness of the remaining film of the unexposed areas was 95% of the initial thickness.

EXAMPLE 2

A resist solution was prepared by dissolving a mixture of 1.5 g of the cyclized polyisoprene and 0.21 g (12% by weight) of the triphenylsilane in 10.0 g of xylene. By using the resist solution, a specimen was prepared in the same manner as in Example 1 and was exposed to light and dry-developed in the same manner as in Example 1. The thickness of the resist film was 1.04 μm, the applied electric power was 0.66 watts/cm$^2$, and the dry-developing time was 10 minutes. In this case, the sensitivity was $8 \times 10^{-6}$ C/cm$^2$, and the thickness of the resist film of the unexposed areas was 44% of the initial thickness.

EXAMPLE 3

The same specimen as that of Example 1 after exposure was dry-developed under the conditions of an argon gas pressure of 0.3 Torr, the applied frequency of 13.56 MHz, and the applied electric power of 0.33 watts/cm$^2$ for 35 minutes. The sensitivity was $2.5 \times 10^{-4}$ C/cm$^2$, and the thickness of the resist film of the unexposed areas was 84% of the initial thickness.

EXAMPLE 4

The same specimen as that of Example 1 after exposure was dry-developed under the conditions of a nitrogen gas pressure of 0.4 Torr, applied frequency of 13.56 MHz, and applied electric power of 0.33 watts/cm$^2$ for 30 minutes. The sensitivity was $9 \times 10^{-5}$ C/cm$^2$, and the thickness of the resist film of the unexposed areas was 65% of the initial thickness.

EXAMPLE 5

A specimen having a resist film of cyclized polyisoprene containing 22% by weight of triphenylvinylsilane was prepared and was dry-developed in the same manner as in Example 1. The thickness of the resist film was 1.27 μm, and the developing time was 15 minutes. The sensitivity in this case was $2 \times 10^{-4}$ C/cm$^2$, and the thickness of the resist film of the unexposed areas was 88% of the initial thickness.

EXAMPLE 6

Polydiallylorthophthalate was admixed with 20% by weight of triphenylsilane and was dissolved in cyclohexanone. hexanone. The solution was applied using a spinner onto a silicon substrate and was heated at 60° C. in a nitrogen stream for 30 minutes. The thickness of the resist film was 1.24 μm. The resist film was then exposed to an electron beam generated at an acceleration voltage of 30 kV and was introduced into a plasma-etching apparatus of the parallel plate-type where the pressure was reduced to $6 \times 10^{-5}$ Torr, and oxygen was then introduced thereto. The specimen was treated with plasma under the conditions of an oxygen gas pressure of 0.4 Torr, applied frequency of 13.56 MHz, and applied electric power of 0.33 watts/cm$^2$ for 17 minutes. The resist film of the exposed areas was removed, and a sensitivity of $1.5 \times 10^{-4}$ C/cm$^2$ was exhibited. The thickness of the resist film of the unexposed areas was 65% of the initial thickness.

EXAMPLE 7

A resist specimen was prepared by adding 20% by weight of triphenylvinylsilane to polydiallylorthophthalate and coating it onto a silicon substrate in the same manner as in Example 6 and was dry-developed in the same manner as in Example 6. The thickness of the resist film was 1.24 μm, and the developing time was 16 minutes. The sensitivity in this case was $1.2 \times 10^{-4}$ C/cm², and the thickness of the resist film of the unexposed areas was 55% of the initial thickness.

EXAMPLE 8

A resist film was prepared from polydiallylorthophthalate and triphenylsilanol. The thickness of the resist film was 1.31 μm, the developing time was 18 minutes, the sensitivity was $1.1 \times 10^{-4}$ C/cm², and the thickness of the resist of the unexposed areas was 35% of the initial thickness.

EXAMPLE 9

A resist film was prepared from polydiallylorthophthalate and triphenylsilanediol. The thickness of the resist film was 1.27 μm, the developing time was 20 minutes, the sensitivity was $1.1 \times 10^{-4}$ C/cm², and the thickness of the resist film of the unexposed areas was 65% of the initial thickness.

EXAMPLE 10

A specimen was prepared in the same manner as in Example 6 by adding triphenylsilane in an amount of 20% by weight to polydiallylisophthalate and was dry-developed. However, the thickness of the resist film was 1.75 μm, and the developing time was 30 minutes. The sensitivity was $1.5 \times 10^{-4}$ C/cm², and the thickness of the film of the unexposed areas was 65% of the initial thickness.

EXAMPLE 11

Polybutadiene was blended with 30% by weight of triphenylsilane and was dissolved in xylene to prepare a specimen in the same manner as in Example 6. The specimen was dry-developed. However, the thickness of the resist film was 1.09 μm, and the developing time was 11 minutes. The sensitivity was $1.0 \times 10^{-4}$ C/cm² and the thickness of the resist film of the unexposed areas was 45% of the initial thickness.

EXAMPLE 12

The specimen as in Example 1 was exposed to the light of a 500-watt deep ultraviolet lamp which had a strong spectrum over the wavelengths of 190 to 250 nanometers and was dry-developed in the same manner as in Example 1. The resist film of the exposed areas was removed, whereas the thickness of the resist film of the unexposed areas was 90% of the initial thickness. In this case, the amount of exposure at which the film thickness became zero was equal to the amount of exposure at which the film thickness became zero when the polymethyl methacrylate was developed using a mixture solution consisting of 4-methyl-2-pentanone and 2-propanol at a ratio of 1:3.

EXAMPLE 13

A specimen was prepared using a blend of cyclized polyisoprene with 15% by weight of 1,1,1-trimethyl-2,2,2-triphenyldisilane and was exposed and developed as described in Example 6. The thickness of the resist film was 1.0 μm, and the developing time was 30 minutes. The sensitivity was $1 \times 10^{-4}$ C/cm², and the thickness of the remained resist film was 98% of the initial thickness.

EXAMPLE 14

A specimen was prepared using a blend of cyclized polyisoprene with 20% by weight of 1,3 divinyl-1,1,3,3-tetraphenyldisiloxa and was exposed and developed as described in Example 6. The thickness of the resist film was 1.0 μm, and the developing time was 30 minutes. The sensitivity was $8 \times 10^{-5}$ C/cm², and the thickness of the remained resist film was 90% of the initial thickness.

EXAMPLE 15

A specimen was prepared using a blend of diglycidyl methacrylate (70 mol %)-ethyl acrylate (30 mol %) copolymer with 25% by weight of triphenylsilane, and was exposed and developed as described in Example 6. The thickness of the resist film was 1.0 μm, and the developing time was 20 minutes. The sensitivity was $7 \times 10^{-5}$ C/cm², and the thickness of the remained resist film was 95% of the initial thickness.

EXAMPLE 16

A specimen was prepared using a blend of polyvinyl chloride with 20% by weight of triphenylsilane and was exposed and developed as described in Example 6. The thickness of the resist film was 0.6 μm, and the developing time was 7 minutes. The sensitivity was $6 \times 10^{-5}$ C/cm², and the thickness of the remaining resist film was 67% of the initial thickness.

EXAMPLE 17

A polyimide resin was coated onto a silicon substrate and heated at 350° C. for 1 hour. The thickness of the polyimide film (first layer) was 1 μm. Then, a solution of a blend of cyclized polyisoprene with 22% by weight of triphenylsilane in xylene was coated onto the polyimide film and heated in a nitrogen stream at 60° C. for 30 minutes. The thickness of this resist film (second layer) was 0.5 μm. The resist film was exposed to an electron beam produced at an acceleration voltage of 30 kV to an exposure amount of $1.5 \times 10^{-4}$ C/cm². The specimen was introduced into a plasma-etching apparatus of the parallel plate type, the pressure in the plasma-etching apparatus was reduced to $6 \times 10^{-5}$ Torr, and oxygen was introduced thereto. Under the conditions of an oxygen gas pressure of 0.4 Torr, a frequency of 13.56 MHz, and an electric power of 0.33 watts/cm², the second layer of the specimen was developed for 15 minutes and, then, the first layer was completely etched for a further 20 minutes. The thickness of the retained film was about 1.5 μm.

EXAMPLE 18

A phenol-formaldehyde resin was coated onto a silicon substrate and heated at 200° C. for 1 hour. The resin film (first layer) had a thickness of 1 μm. Then, a solution of a blend of cyclized polyisoprene with 22% by weight of triphenylvinylsilane in xylene was coated onto the first layer and heated in a nitrogen stream at 60° C. for 30 minutes. The thickness of this resist film (second layer) was 0.5 μm. The specimen was exposed and plasma treated as described in Example 17. The second layer was developed for 8 minutes, and the first layer was completely etched for 7 minutes. The retained film had a thickness of about 1.4 μm.

We claim:

1. A dry-developing positive resist composition consisting of (a) a polymeric material containing, in the molecular sructure, (i) unsaturated hydrocarbon bonds including at least one of vinyl, allyl, cinnamoyl, or acryl double bonds, (ii) epoxy groups or (iii) halogen atoms, and (b) 1% to 70% by weight, based on the weight of the composition, of a silicon compound, wherein the silicon compound is selected from the group consisting of bis(p-biphenyl)diphenylsilane, bis(phenylamino)dimethysilane, t-butyldimethylchlorosilane, t-butyldiphenylchlorosilane, dibenzyldimethylsilane, dicyanodimethylsilane, diphenylsilanediol, tetraacetoxysilane, tetraphenoxysilane, tetraphenoxysilane, tetraphenysilane, tribenzylchlorosilane, triphenylchorosilane, triphenylethylsilane, triphenylfluorosilane, triphenylsilane, triphenylsilanol, triphenylsilylazido, triphenylvinylsilane, 1,2-dimethyl-1,1,2,2-tetraphenyldisilane, 1,1,1-trimethyl-2,2,2-triphenyldisilane, 1,3-dimethyl-1,1,3,3-tetraphenyldisiloxane, 1,3,-divinyl-1,1,3,3-tetraphenyldisiloxane, 1,3-ethoxy-1,1,3,3-teraphenyldisiloxane, 1,1,5,5-tetraphenyl-1,3,3,5-tetramethyltrisiloxane and 1,4-bis(hydroxydimethylsilyl)benzene.

2. A process for forming a positive resist pattern on a substrate, comprising
coating the substrate to form a resist layer, said resist layer comprising (a) a polymeric material containing, in the molecular structure, (i) unsaturated hydrocarbon bonds including vinyl, allyl, cinnamoyl, or acryl double bonds, (ii) epoxy groups or (iii) halogen atoms, and (b) 1% to 70% by weight, based on the weight of the composition, of a silicon compound,
selectively exposing the resist layer to radiation, and developing a positive resist pattern on the substrate by treatment with gas plasma to remove the part of said resist layer exposed to said radiation.

3. A process as claimed in claim 2, wherein the radiation is selected from an electron beam, X-ray, ion beam and deep ultraviolet radiation.

4. A process as claimed in claim 2, wherein the gas plasma is selected form oxygen plasma, argon gas plasma, mixed oxygen-argon gas plasma, and mixed oxygen-fluorine gas plasma.

5. A process as claimed in claim 2, wherein an intermediate layer is provided between the resist layer and the substrate, and said treatment with gas plasma also etches said intermediate layer.

6. A process as claimed in claim 5 wherein the intermediate layer is composed of polyvinyl carbazole, polystyrene, phenol resin, cyclized polyisoprene, or polyimide.

7. The process of claim 2 or 5, wherein said silicon compound is selected from the group consisting of the compounds of the following formulae I to V,

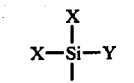

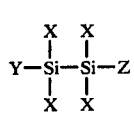

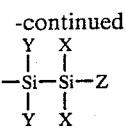

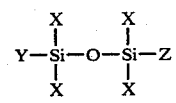

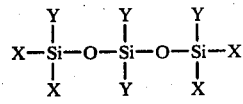

in which each X represents methyl, phenyl, biphenyl, phenylamino, phenoxy, benzyl, cyano, vinyl, or acetoxy; each Y represents hydrogen, hydroxy, azido, vinyl, methoxy, ethoxy, butoxy, phenoxy, halogen, benzyl, phenyl, methyl, t-butyl, biphenyl, or acetoxy; and each Z represents phenyl, hydroxy, vinyl, methoxy, ethoxy, butoxy, benzyl, methyl, t-butyl, phenoxy, halogen, biphenyl, or acetoxy; and 1,4-bis(hydroxydimethyl-silyl)benzene.

8. The process of claim 7, wherein the polymeric material is selected fromt the group consisting of polyglycidyl methacrylate, epoxydated polybutadiene, glycidyl methacrylateethyl methacrylate copolymer, and vinyl halide polymers.

9. The process of claim 7, wherein the polymeric material is selected from the group consisting of polymers of alkadienes, cyclized polymers thereof or copolymers thereof with monomers copolymerizable with the alkadiene monomers, polymers of dicarboxylic diallyl esters, polymers of triallyl cyanurate or isocyanurate or copolymers thereof, polymers having cynnamoyl groups, polymers having acryl or methacryl groups, and unsaturated polyesters.

10. The process of claim 7, wherein the silicon compound is selected from the group consisting of bis(p-biphenyl)diphenylsilane, bis(phenyl-amino)dimethylsilane, t-butyldimethylchlorosilane, t-butyl-diphenylchlorosilane, dibenzyldimethylsilane, dicyanodimethylsilane, diphenylsilanediol, tetraacetoxysilane, tetraphenoxysilane, tetraphenylsilane, tribenzylchlorosilane, triphenylchlorosilane, triphenylethylsilane, triphenylflorosilane, triphenylsilane, triphenylsilanol, triphenylsilylazido, triphenylvinylsilane, 1,2-dimethyl-1,1,2,2-tetraphenyldisilane, 1,1,1-trimethyl-2,2,2-triphenyldisilane, 1,3-dimethyl-1,1,3,3-tetraphenyldisiloxane, 1,3-divinyl-1,1,3,3-tetraphenyldisiloxane, 1,3-ethoxy-1,1,3,3-tetraphenyldisiloxane, 1,1,5,5-tetraphenyl-1,3,3,5-tetramethyltrisiloxane.

11. The process of claim 2, 3, 4, 5 or 6, wherein no further step is required for providing said positive resist pattern between said exposing to said radiation and said developing treatment with said gas plasma.

12. The process of claim 7, wherein no further step is required for providing said positive resist pattern between said exposing to said radiation and said developing treatment with said gas plasma.

13. A dry-developing positive resist composition consisting of (a) a polymeric material containing, in the molecular structure, (i) unsaturated hydrocarbon bonds including vinyl, allyl, cinnamoyl, or acryl double bonds, (ii) epoxy groups or (iii) halogen atoms, and (b) 1% to 70% by weight, based on the weight of the composition, of a silicon compound, wherein the silicon compound is selected from the group consisting of:

the compounds of the following formulas,

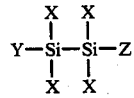  II

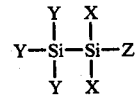  III

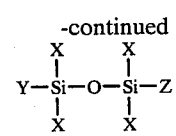  IV

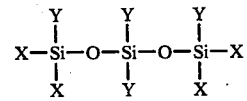  V in which each X represents methyl, phenyl, biphenyl, phenylamino, phenoxy, benzyl, cyano, vinyl, or acetoxy; each Y represents hydrogen, hydroxy, azido, vinyl, methoxy, ethoxy, butoxy, phenoxy, halogen, benzyl, phenyl, methyl, t-butyl, biphenyl, or acetoxy; and each Z represents phenyl, hydroxy, vinyl, methoxy, ethoxy, butoxy, benzyl, methyl, t-butyl, phenoxy, halogen, biphenyl, or acetoxy; and 1,4-bis(hydroxydimethyl-silyl)benzene.

* * * * *